United States Patent
Iida et al.

[11] Patent Number: 6,120,599
[45] Date of Patent: Sep. 19, 2000

[54] SILICON SINGLE CRYSTAL WAFER HAVING FEW CRYSTAL DEFECTS, AND METHOD FOR PRODUCING THE SAME

[75] Inventors: Makoto Iida; Eiichi Iino; Masanori Kimura; Shozo Muraoka, all of Gunma-ken, Japan

[73] Assignee: Shin-Etsu Handotai Co., Ltd., Tokyo, Japan

[21] Appl. No.: 09/454,841

[22] Filed: Dec. 6, 1999

Related U.S. Application Data

[62] Division of application No. 09/188,490, Nov. 9, 1998, Pat. No. 6,066,306.

[30] Foreign Application Priority Data

Nov. 11, 1997 [JP] Japan .................................. 9-325428

[51] Int. Cl.$^7$ .................................................. C30B 15/20
[52] U.S. Cl. .................................................. 117/20; 117/13
[58] Field of Search .......................................... 117/13, 20

[56] References Cited

FOREIGN PATENT DOCUMENTS

| | | |
|---|---|---|
| 4192345 | 7/1992 | Japan . |
| 7257991 | 10/1995 | Japan . |
| 8012493 | 1/1996 | Japan . |
| 8268794 | 10/1996 | Japan . |
| 8330316 | 12/1996 | Japan . |

OTHER PUBLICATIONS

Yamashita et al., "Effects of Thermal History on OSF Formation in CZ Silicon Crystals," Electrochemical Society Extended Abstracts, vol., 89–1, May 1989, pp. 346–347.

Dupret et al.. "Global Modelling of Heat Transfer in Crystal Growth Furnaces," *Int. J. Heat Mass Transfer*, vol. 33, No. 9, pp. 1849–1871, 1990.

Sadamitsu et al. "Dependence of the Grown–in Defect Distribution on Growth Rates in Czochralski Silicon," *Jpn. J. Appl. Phys.*, vol. 32 (1993) pp. 3675–3681, Part 1, No. 9A, Sep. 1993.

*Primary Examiner*—Felisa Garrett
*Attorney, Agent, or Firm*—Hogan & Hartson, LLP

[57] ABSTRACT

In a method for producing a silicon single crystal wafer, a silicon single crystal is grown in accordance with the Czochralski method such that the F/G value becomes 0.112–0.142 mm$^2$/° C.·min at the center of the crystal, where F is a pulling rate (mm/min) of the single crystal, and G is an average intra-crystal temperature gradient (° C./mm) along the pulling direction within a temperature range of the melting point of silicon to 1400° C. Additionally, the single crystal is pulled such that the interstitial oxygen concentration becomes less than 24 ppma, or the time required to pass through a temperature zone of 1050–850° C. within the crystal is controlled to become 140 minutes or less. The method allows production of silicon single crystal wafers in which neither FPDs nor L/D defects exist on the wafer surface, which therefore has an extremely low defect density, and whose entire surface is usable.

4 Claims, 4 Drawing Sheets

SILICON SINGLE CRYSTAL WAFER HAVING FEW CRYSTAL DEFECTS, AND METHOD FOR PRODUCING THE SAME

This is a division of application Ser. No. 09/188,490 filed Nov. 9, 1998 now U.S. Pat. No. 6,066,306, which application is hereby incorporated by reference in its entirety.

BACKGROUND OF THE INVENTION

1. Field of the Invention

The present invention relates to a silicon single crystal wafer having few crystal defects, as well as to a method for producing such a silicon single crystal wafer.

2. Description of the Related Art

Along with a decrease in size of semiconductor devices for achieving an increased degree of integration of semiconductor circuits, more severe quality requirements have recently been imposed on silicon single crystals which are grown by the Czochralski method (hereinafter referred to as the CZ method) for use as materials for substrates of semiconductor circuits. Particularly, there has been required a reduction in density and size of grown-indefects such as flow pattern defects (FPDs), laser scattering tomography defects (LSTDs), and crystal originated particles (COPs), which are generated during the growth of a single crystal and degrade oxide dielectric breakdown voltage and characteristics of devices.

In connection with the above-mentioned defects incorporated into a silicon single crystal, first are described factors which determine the concentration of a point defect called a vacancy (hereinafter may be referred to as V) and the concentration of a point defect called an interstitial (hereinafter may be referred to as I).

In a silicon single crystal, a V region refers to a region which contains a relatively large number of vacancies, i.e., depressions, pits, voids or the like caused by missing silicon atoms; and an I region refers to a region which contains a relatively large number of dislocations caused by excess silicon atoms or a relatively large number of clusters of excess silicon atoms. Further, between the V region and the I region there exists a neutral (hereinafter may be referred to as N) region which contains no or few excess or missing silicon atoms. Recent studies have revealed that the above-mentioned grown-in defects such as FPDs, LSTDs, and COPs are generated only when vacancies and/or interstitials are present in a supersaturated state and that even when some atoms deviate from their ideal positions, they do not appear as a defect so long as vacancies and/or interstitials do not exceed the saturation level.

It has been confirmed that the concentration of vacancies and/or interstitials depends on the relation between the pulling rate (growth rate) of crystal in the CZ method and the temperature gradient G in the vicinity of a solid-liquid interface of a growing crystal, and that another type of defect called oxidation-induced stacking fault (OSF) is present in ring-shape distribution in the vicinity of the boundary between the V region and the I region.

The manner of generation of defects due to growth of a crystal changes depending on the growth rate. That is, when the growth rate is relatively high; e.g., about 0.6 mm/min, grown-in defects such as FPDs, LSTDs, and COPs—which are believed to be generated due to voids at which vacancy-type points defects aggregate—are present at a high density over the entire radial cross section of a crystal. The region where these defects are present is called a "V-rich region" (see FIG. 4(a)). When the growth rate is not greater than 0.6 mm/min, as the growth rate decreases the above-described OSF ring is generated from a circumferential portion of the crystal. In such a case, L/D (large dislocation, simplified expression of interstitial dislocation loop) defects such as LSEPDs and LFPDs—which are believed to be generated due to dislocation loop—are present at a low density outside the OSF ring. The region where these defects are present is called an "I-rich region" (see FIG. 4(b)). Further, when the growth rate is decreased to about 0.4 mm/min, the above-described OSF ring converges to the center of a wafer and disappears, so that the I-rich region spreads over the entire cross section of the wafer (see FIG. 4(c)).

Further, there has been found the existence of a region, called a N (neutral) region, which is located between the V-rich region and the I-rich region and outside the OSF ring and in which there exist neither grown-in defects (FPDs, LSTDs, and COPs) stemming from voids nor L/D defects (LSEPDs and LFPDs) stemming from a dislocation loop (see Japanese Patent Application Laid-Open (kokai) No. 8-330316). The N region has been reported to be located outside the OSF ring and is on an I-rich region side, so that substantially no oxygen precipitation occurs there when a single crystal is subjected to a heat treatment for oxygen precipitation and the contrast due to oxide precipitates is observed through use of an X-ray beam. Further, the N region is not rich enough to cause formation of LSEPDs and LFPDs (see FIG. 3(a)). Also, it has been proposed that the N region can be expanded over the entire wafer surface when a ratio F/G is controlled to fall within the range of 0.20–0.22 mm²/° C.·min through an improvement of the intra-furnace temperature distribution of a pulling apparatus and adjustment of the pulling rate, wherein F is a pulling rate (mm/min) of the single crystal, and G is an average intra-crystal temperature gradient (° C./mm) along the pulling direction within a temperature range of the melting point of silicon to 1300° C. (see FIG. 3(b)).

However, when a single crystal is produced such that the region having a very low defect density is expanded to the entire crystal, the control range of production conditions becomes extremely narrow, because the region must be an I-rich region side N region. Setting aside experimental apparatus, such precise control is difficult to perform in a mass-production-type apparatus. Further, since productivity is low, the proposed technique is not practical.

Further, the inventors of the present invention found that the defect distribution chart shown the in above-mentioned patent publication greatly differs from data that the inventors of the present invention obtained through experiments and investigations and consequently from a defect distribution chart (see FIG. 1) that was made based on the thus-obtained data.

SUMMARY OF THE INVENTION

In view of the foregoing, an object of the invention is to enable highly efficient production of a silicon single crystal wafer in accordance with the CZ method, under production conditions that broaden the range of control and facilitate control, such that the silicon single crystal wafer has neither a V-rich region nor an I-rich region and therefore has an extremely low defect density over the entire surface of the crystal.

In order to achieve the above-described object, the present invention provides a silicon single crystal wafer produced in accordance with the CZ method, wherein the wafer includes an OSF ring or nuclei of an OSF ring that appear in the shape of a ring when the wafer is subjected to thermal oxidation treatment, and neither FPDs nor L/D defects exist on the wafer surface.

The present invention also provide a method for producing such a silicon single crystal wafer in which a silicon single crystal is grown in accordance with the CZ method in a region located between a boundary between a V-rich region and an N region and a boundary between the N region and an I-rich region in a defect distribution chart which shows a defect distribution in which the horizontal axis represents a radial distance D (mm) from the center of the crystal and the vertical axis represent a value of F/G (mm$^2$/° C.·min), where F is a pulling rate (mm/min) of the single crystal, and G is an average intra-crystal temperature gradient (° C./mm) along the pulling direction within a temperature range of the melting point of silicon to 1400° C.

When the pulling rate F of a single crystal and the average intra-crystal temperature gradient G along the pulling direction within a temperature range of the melting point of silicon to 1400° C. are controlled such that the single crystal is grown in a region located between a boundary between a V-rich region and an N region and a boundary between the N region and an I-rich region in the defect distribution chart (see FIG. 1) obtained through analysis of results of experiments and investigations, there can be produced a silicon single crystal wafer according to the present invention, wherein there are present an OSF ring or nuclei of an OSF ring that appears in the shape of a ring when the wafer is subjected to thermal oxidation treatment, and neither FPDs nor L/D defects exist on the wafer surface.

Preferably, the growth of the single crystal is performed such that the above-described F/G value becomes 0.112–0.142 mm$^2$/° C.·min at the center of the crystal.

When control is performed such that the above-described F/G value becomes 0.112–0.142 mm$^2$/° C.·min at the center of the crystal as described above, as shown in the defect distribution chart of FIG. 1, the single crystal includes a region where an OSF ring maybe generated upon performance of thermal oxidation treatment. However, since the single crystal is pulled such that the areas of the N regions located inside and outside the OSF ring region are maximized, the range of control in relation to the pulling rate and the intra-crystal temperature gradient increases. Therefore, even in a pulling apparatus designed for mass production, production conditions can be easily set, and thus wafers having a large N region can be easily produced.

In a silicon single crystal wafer produced in the above-described manner, when the wafer is subjected to thermal oxidation treatment, latent nuclei of an OSF ring exist, or an OSF ring appears in the shape of a ring. However, neither FPDs nor L/D defects exist on the wafer surface. As shown in FIG. 2(b), in the single crystal wafer, neither the V-rich region nor the I-rich region exists on a so-called wafer surface, so that the area of the N (neutral) region is very large. The silicon single crystal wafer of the present invention having a large N region takes advantage of the fact that the N region also exists on the inner side of an OSF region where OSF ring nuclei exits and therefore an OSF ring may be generated when the wafer is subjected to thermal oxidation treatment. Thus, the silicon single crystal wafer of the present invention has a novel defect structure in which the N regions outside and inside the OSF ring has been expanded to a possible extent.

The present invention further provides a silicon single crystal wafer grown in accordance with the CZ method, wherein the oxygen concentration of the entire wafer surface is less than 24 ppma (value of ASTM '79); although latent nuclei of an OSF ring is present after heat treatment for oxygen precipitation, no OSF ring is generated when the wafer is subjected to an OSF thermal oxidation process; and neither FPDs nor L/D defects exist on the wafer surface.

When the production method of the present invention is performed, the time required for passing through a temperature zone of 1050° C.–850° C. within the crystal is preferably controlled to become 140 minutes or less.

When the oxygen concentration within a single crystal being grown is suppressed to less than 24 ppma or the thermal history of the single crystal is controlled such that the time required for passing through a temperature zone of 1050° C.–850° C. within the crystal is set to 140 minutes or less, growth of an OSF nucleus can be prevented. Therefore, even when an OSF ring or latent nuclei of the OSF ring exist within a wafer, devices are not affected. That is, although latent nuclei of an OSF ring are present in a wafer when the wafer is subjected to an OSF thermal oxidation treatment, no OSF ring is actually generated. Thus, there can be obtained a wafer in which neither FPDs nor L/D defects (LSEPD, LFPD) are generated on the wafer surface; i.e., none of a V-rich region, an I-rich region, and a harmful OSF ring exists on the wafer surface; whose entire surface therefore can be used; and which has an extremely low defect density over the entire wafer surface. In addition, since the range of control of F/G can be widened, and thus production of wafers can be facilitated.

As described above, according to the present invention, the range of control on the conditions of growth of a single crystal becomes wider, so that there can be easily produced wafers in which the area of the N region is maximized through utilization of an OSF ring, OSF nuclei, an N region outside the OSF ring, and an N region inside the OSF ring. When reduction of oxygen concentration or control of the thermal history in a low temperature zone is additionally employed, no OSF ring is generated, so that it becomes possible to produce a silicon single crystal wafer which has a very low grown-in defect density, and whose entire surface is substantially free of defects.

BRIEF DESCRIPTION OF THE DRAWINGS

FIG. 2 is an explanatory view showing defect distribution in a cross section of a silicon single crystal discovered by the inventors of the present invention, wherein section

FIG. 3 is an explanatory view showing defect distribution in a cross section of a silicon single crystal grown in accordance with a conventional pulling method, wherein section

FIG. 4 is an explanatory view showing the relationship between pulling rate and defect distribution in a cross section of a single crystal grown in accordance with a conventional pulling method, wherein section

FIG. 5 is an explanatory diagram for the present invention which shows the effect of interstitial oxygen concentration on the position of a boundary between a region in which an OSF ring generated by thermal oxidation treatment on a wafer and a region in which OSF nuclei are present, wherein section

DESCRIPTION OF THE INVENTION AND THE PREFERRED EMBODIMENTS

Figure 1:
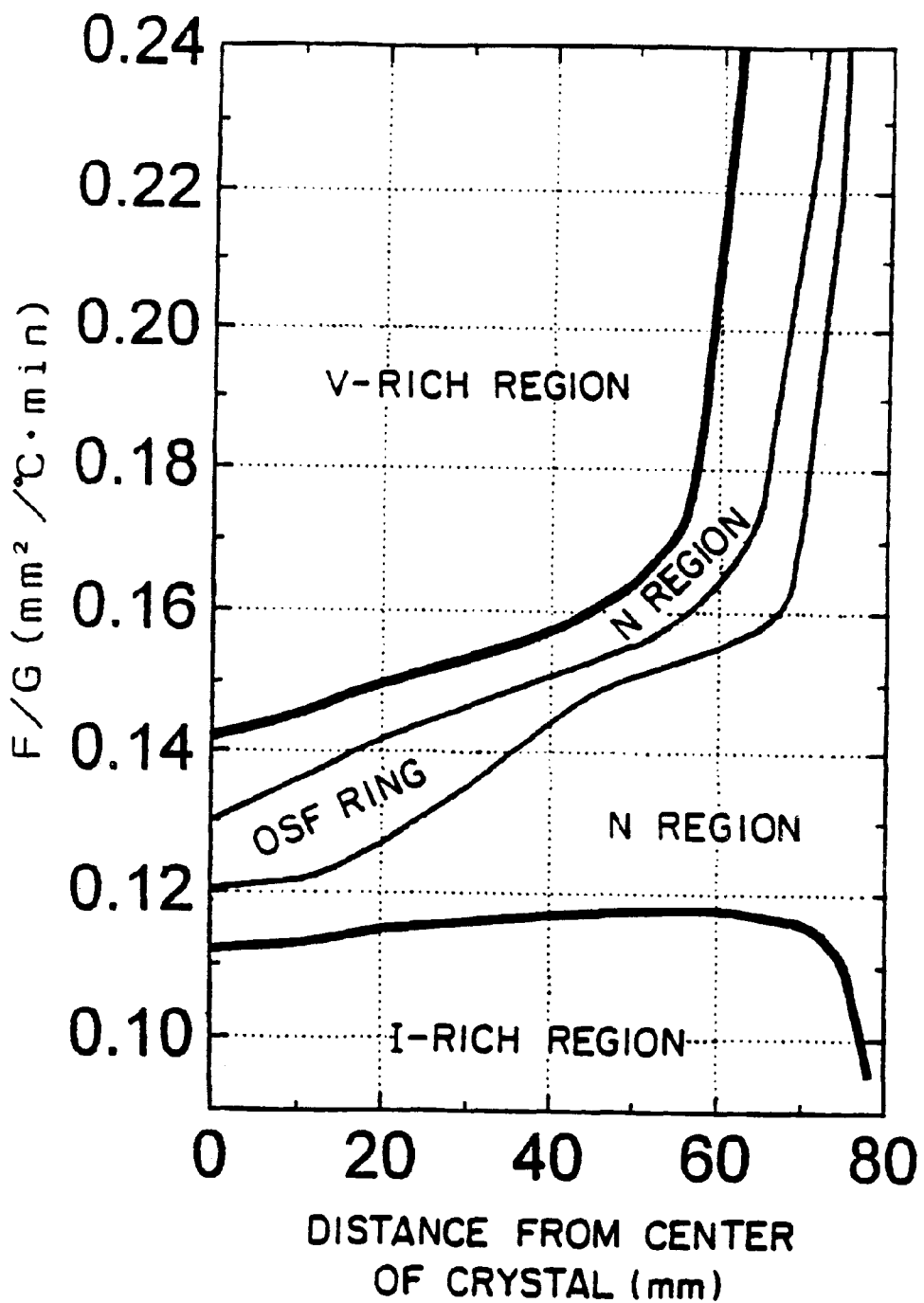
FIG. 1 is a defect distribution chart which shows defect distribution in a cross section of a silicon single crystal wherein the horizontal axis is a radial direction, and the vertical axis is an F/G value.

The present invention will now be described in detail, but the present invention is not limited thereto. First, terms appearing herein will be described.

1) FPD (Flow Pattern Defect) denotes flow patterns which, together with pits, are generated in the surface of a wafer which is sliced from a grown silicon single-crystal ingot and which is treated by the steps of: removing a damaged layer from the surface portion of the wafer through etching with a mixed solution of hydrofluoric acid and nitric acid; and etching the wafer surface with a mixed solution of $K_2Cr_2O_7$, hydrofluoric acid, and water (Secco etching). As FPD density in the wafer surface portion becomes higher, failure rate with regard to dielectric breakdown strength of oxide film increase (Japanese Patent Laid-Open (kokai) No. 4-192345).

2) SEPD (Secco Etch Pit Defect) denotes pits which are generated alone in the surface portion of a wafer which is Secco-etched in the same manner as in the case of FPD. Pits accompanied by flow patterns are generically referred to as FPD. Pits not accompanied by flow patterns are generically referred to as SEPD. SEPD having a size not smaller than 10 $\mu$m conceivably derives from a dislocation-cluster. When a dislocation cluster is present in a device, current leaks through the dislocation; consequently, the function of a P-N junction is not effected.

3) LSTD (Laser Scattering Tomography Defect) denotes a defect existing in a wafer, and the scattering light due to the defect can be detected in the following manner. That is, a wafer is sliced from a grown silicon single-crystal ingot, and is then treated by the steps of: removing a damaged layer from the surface portion of the wafer through etching with a mixed solution of hydrofluoric acid and nitric acid; and cleaving the wafer. When infrared light is introduced into the wafer through the cleavage plane, and light exiting from the wafer surface is detected, a scattering light due to the defects existing in a wafer can be detected. A scattering defect detected in this observation has already been reported at a meeting of an academic society or the like and is considered to be an oxide precipitate (J.J.A.P. vol. 32, p. 3679, 1993). According to recent research, LSTD is reported to be an octahedral void.

4) COP (Crystal Originated Particle) denotes a defect which deteriorates the dielectric breakdown strength of oxide film at a central portion of a wafer and which is revealed as FPD in the case of treatment through Secco etching, but is revealed as COP in the case of cleaning in SC-1 (cleaning by using mixed aqueous solution of ammonia, hydrogen peroxide, example of ratio is $NH_4OH:H_2O_2:H_2O=1:1:10$) which serves as a selective etchant. The pit has a diameter not greater than 1 $\mu$m and is examined by a light scattering method.

5) L/D (large dislocation; simplified expression of interstitial dislocation loop) denotes defects, such as LSEPD and LFPD, which are considered to generated due to a dislocation loop. As described above, LSEPD reefers to SEPD having a size not less than 10 $\mu$m, while LFPD refers to FPD whose tip end pit has a size not less than 10 $\mu$m. These are also considered to be generated due to dislocation loops.

As described in Japanese Patent Application No. 9-199415, the inventors of the present invention investigated in detail defects generated in the vicinity of a boundary between a V region and an I region of a silicon single crystal grown according to the CZ method and found that in the vicinity of the boundary there exists a very narrow neutral region in which the number of FPDs, LSTDs, and COPs is considerably low, and no LSEPDs exist.

Based on the above-described finding, the present inventors conceived that if the neutral region can be expanded to the entire cross section of a single crystal, the number of point defects can be greatly decreased. That is, when the growth (pulling) rate of a single crystal and the temperature gradient therein, both of which affect the distribution of point defects within the cross section, are considered, there can be drawn the conclusion that the main factor that determines the distribution of point defects within the cross section is the temperature gradient, because the pulling speed is substantially constant throughout the cross section of the crystal. That is, the present inventors found that one problem is variation in the temperature gradient in the axial direction among different points within a cross section of the crystal and also found that if such variation can be decreased, the variation in the point defect density across the cross section can be decreased. Thus, the present inventors of the present invention succeeded in obtaining a defect-free wafer whose entire surface is occupied by an N region, through control of the intra-furnace temperature and adjustment of the pulling rate such that the difference $\Delta G$ between the temperature gradient Gc at the center of a crystal and the temperature gradient Ge at the circumferential portion of the crystal becomes equal to or less than 5° C./cm [$\Delta G=(Ge-Gc) \leq 5°$ C./cm].

The inventors of the present invention investigated a cross section of a single crystal that had been pulled through use of a crystal pulling apparatus operated in accordance with the CZ method to produce the above-described small temperature gradient difference $\Delta G$, while changing the pulling speed, and found the following.

Figure 2A:
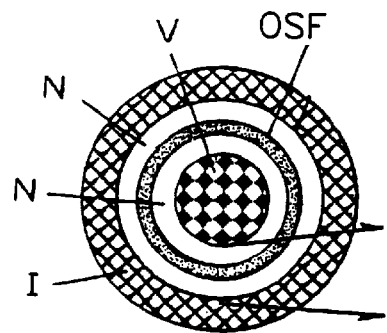
FIG. 2(a) is for the case where the silicon single crystal is pulled under an ordinary pulling condition, and section
Figure 2B:
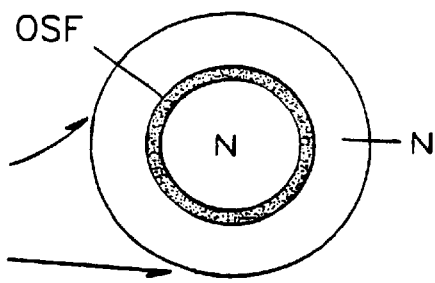
FIG. 2(b) is for the case where the silicon single crystal is pulled under a specific pulling condition according to the present invention.

Although an N region between a V-rich region and an I-rich region has conventionally been considered to be present only outside an OSF ring (nucleus), the N region is also present inside the OSF ring (see FIG. 2 (a)). In the above-described Patent Application No. 9-199415, the OSF ring is described as serving as a boundary region between the V-rich region and the N-rich region (see FIG. 3 (a)). The description in the patent application does not necessarily coincide with the findings confirmed by the present inventors. This was not discovered in an experiment performed through used of a conventional crystal pulling apparatus producing a large $\Delta G$, but was discovered by investing a single crystal grown through use of the above-described crystal pulling apparatus producing a small $\Delta G$.

In the course of investigation, the present inventors analyzed the intra-furnace temperature of the pulling apparatus through use of a total heat-transmission analyzing program FEMAG (F. Dupret, P. Nicodeme, Y. Ryckmans, P. Wouters, and M. J. Crochet, Int. J. Heat Mass Transfer, 33, 1849 (1990)). As a result, they found that a silicon single crystal wafer which includes an OSF ring or nuclei of an OSF ring which appear in a ring-like shape upon performance of OSF thermal oxidation treatment but includes neither FPDs nor L/D defects on the wafer surface can be obtained if the pulling is performed such that the F/G value falls within the range of 0.112–0.142 mm$^2$/° C.·min at the center of the crystal, where F is a pulling rate (mm/min) of a single crystal, and G is an average intra-crystal temperature gradient (° C./mm) along the pulling direction within a temperature range of the melting point of silicon to 1400° C.

FIG. 1 shows defect distribution within a single crystal (diameter: 6 inches) wherein the horizontal axis represents the radial position of the crystal and the vertical axis represents the F/G value. As is apparent from FIG. 1, in a section from the center of the crystal to a point about 50 mm away from the center, the boundary between the V-rich region and the N region starts from a point at 0.142 mm$^2$/° C.·min with a relatively small positive slope. After the point about 50 mm away from the center, the slope of the boundary increases abruptly. The center of the OSF ring starts from a point at about 0.125 mm$^2$/° C.·min with a relatively small positive slope. The center of the OSF ring region is parallel to the boundary between the V-rich region and the N region. Near the outer circumferential portion of the crystal, the respective slopes increase abruptly. Further, the boundary between the N region and the I-rich region starts from a point at about 0.112 mm$^2$/° C.·min and extends in a substantially horizontal direction. After a point about 70 mm away from the center, the slope of the boundary becomes negative, and the negative slope increases abruptly.

Accordingly, in order to maximally utilize the N region including the OSF ring region of a wafer, the pulling rate F and the average temperature gradient G must be controlled such that the F/G value falls within the range of 0.112–0.142 mm$^2$/° C.·min at the center of the crystal.

Figure 3A:
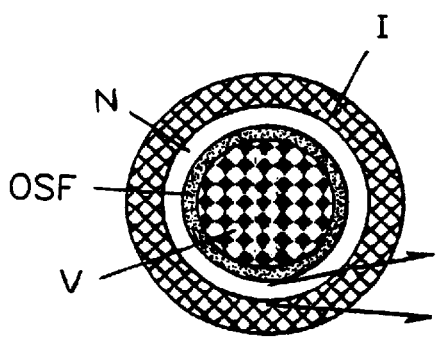
FIG. 3(a) is for the case where the silicon single crystal is pulled under an ordinary pulling condition, and section
Figure 3B:
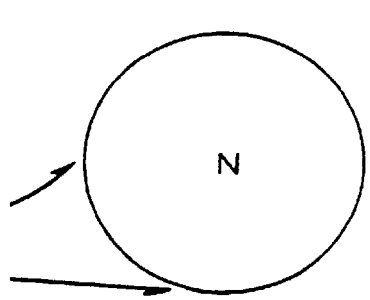
FIG. 3(b) is for the case where a crystal is pulled, while the pulling rate and the temperature gradient within the crystal are accurately controlled.
Figure 4A:
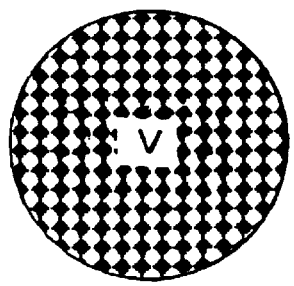
FIG. 4(a) is for the case of high-rate pulling, section
Figure 4B:
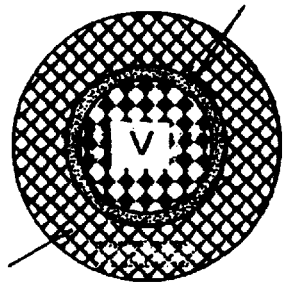
FIG. 4(b) is for the case of intermediate-rate pulling, and section
Figure 4C:
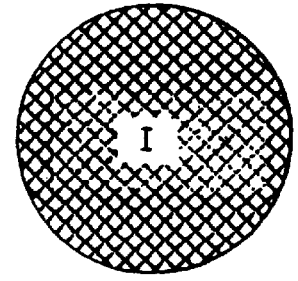
FIG. 4(c) is for the case of low-rate pulling.

Conventionally, as shown in FIG. 3 (a), the pulling rate and ΔG are controlled through use of a special pulling apparatus, such that an N region that exists outside an OSF ring formed when the pulling is performed at an ordinary rate and through use of an ordinary pulling apparatus is expanded throughout the entire cross section of the crystal (see FIG. 3 (b)). In this way, a defect-free single crystal is manufactured. However, since the range of control on production conditions such as pulling rate and temperature gradient is extremely narrow, the control is difficult and the productivity is poor.

In the present invention, the used region is not limited to the N region outside the OSF ring, but the N region inside the OSF ring (see FIG. 2 (a)) is also used in order to maximize the area of the N region. That is, as shown in FIG. 2 (b), a single crystal is pulled at a pulling rate and ΔG and through use of a crystal pulling apparatus which allows the N region including the OSF ring to be extended throughout the wafer surface. As a result, when the pulling is performed while the pulling rate and the intra-crystal temperature gradient are adjusted such that the F/G value falls within the above-described range, low-defect wafers can be produced under production conditions that afford an expanded control range compared to the case of the conventional method.

Meanwhile, recent studies in relation to OSF rings have revealed that in the case where the oxygen concentration is lower than a predetermined level over the entire wafer surface, even if nuclei of an OSF ring are present, the OSF ring is not generated through thermal oxidation treatment, and therefore does not affect devices fabricated on the wafer.

An experiment in which single crystals having different oxygen concentrations were pulled through use of the same crystal pulling apparatus confirmed that when the oxygen concentration throughout the entire wafer surface is less than 24 ppma, no OSF ring is generated even when the wafer is subjected to thermal oxidation treatment.

Figure 5A:
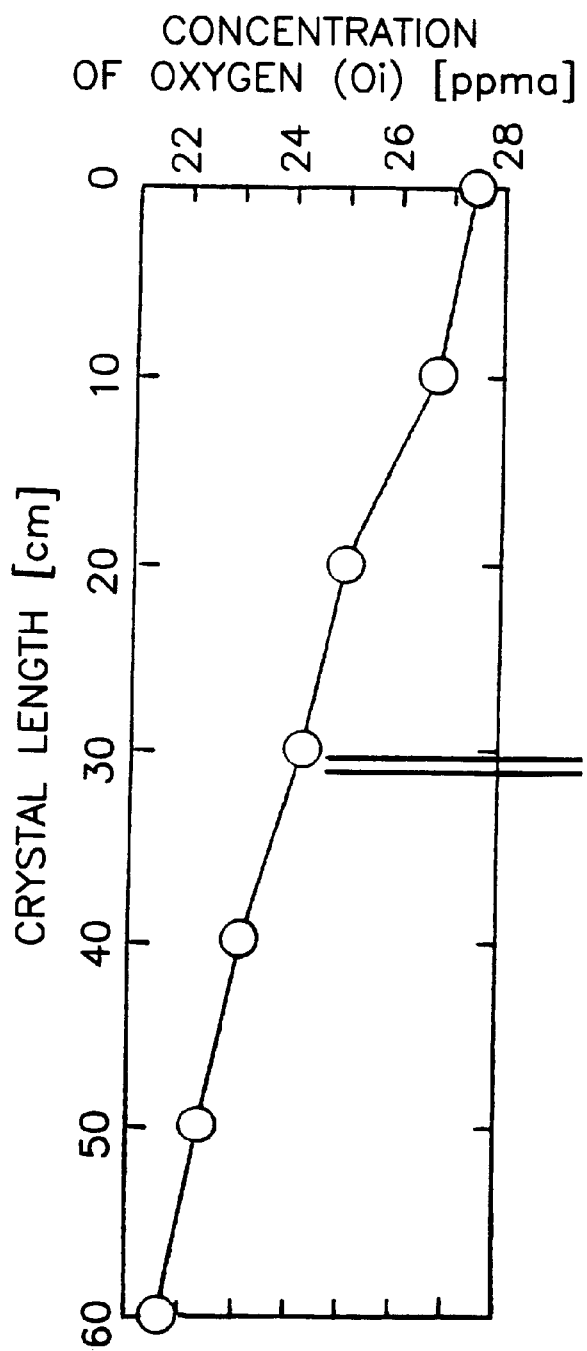
FIG. 5(a) is a graph showing the relationship between the longitudinal position of a crystal ingot and the oxygen concentration, and section
Figure 5B:
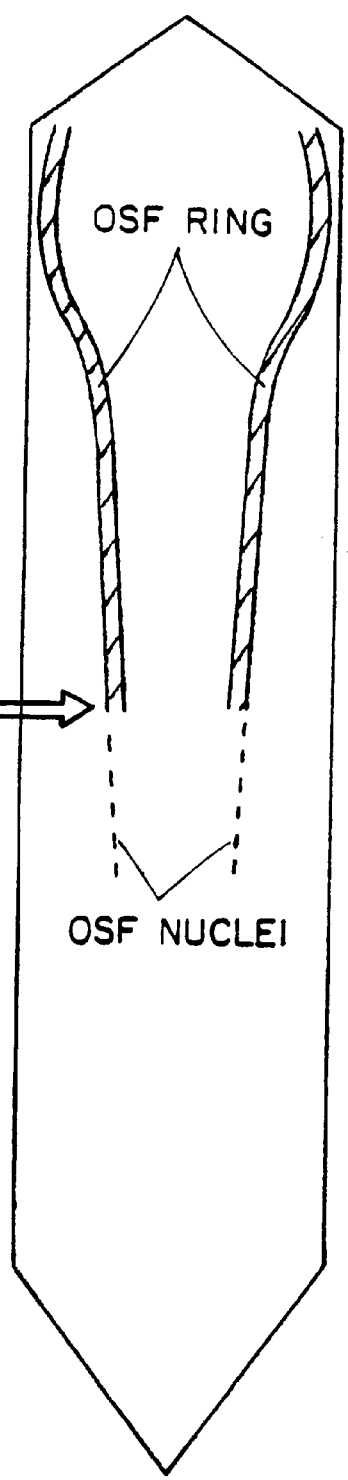
FIG. 5(b) is an explanatory view showing the position of the boundary between the region where an OSF ring is generated and a region where OSF nuclei are present.

That is, as shown in FIG. 5(b), which shows an OSF ring formed in a single crystal produced while the oxygen concentration is gradually decreased during the pulling operation, nuclei of the OSF ring exist over the entire length of the crystal; however, an OSF ring is observed upon performance of thermal oxidization treatment on the wafer only when the oxygen concentration is equal to or greater than 24 ppma. When the oxygen concentration becomes less than 24 ppma, no OSF ring is generated upon performance of thermal oxidization treatment even though OSF ring nuclei are present.

The oxygen concentration in a crystal being grown can be easily made less than 24 ppma through a conventional method, e.g., a method in which the rotational speed of a crucible or the intra-melt temperature distribution is adjusted to thereby control the convection of the melt.

Even when no OSF ring is generated, the amount of precipitated oxygen tends to decrease at locations where nuclei of an OSF exist. However, since strong gettering capability is not required in a device fabrication process performed at a low temperature, even if the amount of precipitated oxygen in the OSF region is small, the device fabrication process is not adversely affected thereby.

Subsequently, the conditions for preventing the growth of OSF ring nuclei are studied. For the experiment, there were prepared several crystal pulling apparatus having different intra-furnace temperature distributions (i.e., having different intra-furnace structures). Each of these pulling apparatus was used to pull a single crystal while the pulling rate was controlled such that an OSF ring was generated during OSF thermal oxidation treatment. The results of this experiment confirm that in the crystals to which a thermal history was imparted by passing the crystal through a temperature zone of 1050–850° C. within 140 minutes or less, no OSF ring was observed even when OSF thermal oxidation treatment for confirming the presence/absence of an OSF ring was performed (see I. Yamashita and Y. Shimanuki, The Electrochemical Society Extended Abstract, Los Angeles, Calif., May 7–12, 1989, Page 346).

Therefore, if in addition to the above-described control of F/G value there are performed control for suppressing the interstitial oxygen concentration to a level lower than 24 ppma and/or control for controlling the thermal history of a crystal being grown such that the crystal passes through the temperature zone of 1050–850° C. within 140 minutes or less to thereby prevent the growth of an OSF ring, there can be produced, under a wide range of conditions, defect-free crystals in which no OSF ring is generated upon performance of OSF thermal oxidation treatment, in which neither FPDs nor L/D defects exist, and whose entire cross section is occupied by a usable region.

In summary, a defect-free silicon single crystal which has a wide N region, in which no OSF ring is generated upon performance of thermal oxidation treatment, and whose entire cross section is a usable can be produced when a silicon single crystal is grown in accordance with the CZ method such that a value of F/G ($mm^2/°C \cdot min$) at the center of the crystal falls within the range of 0.0112–0.142 $mm^2/°C \cdot min$, where F is a pulling rate (mm/min) of the single crystal and G is an average intra-crystal temperature gradient (° C./mm) along the pulling direction within a temperature range of the melting point of silicon to 1400° C.; and the interstitial oxygen concentration is suppressed to a level lower than 24 ppma, and/or control is performed such that the time required for passing through the temperature zone of 1050–850° C. within the crystal becomes 140 minutes or less.

An embodiment of the present invention will now be described in detail with reference to the drawings.

Figure 6:
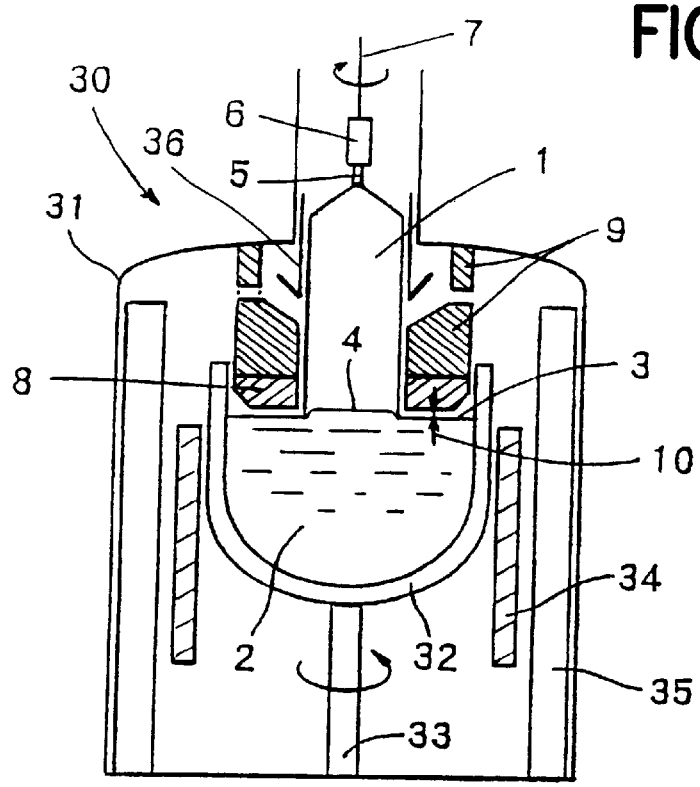
FIG. 6 is a schematic view showing the structure of a single crystal pulling apparatus operated in accordance with the CZ method and used in the present invention.

First, the structure of a crystal pulling apparatus used in the present invention and operated in accordance with the CZ method will be described with reference to FIG. 6. As shown in FIG. 6, the crystal pulling apparatus 30 includes a pull chamber 31, a crucible 32 provided within the pull chamber 31, a heater 34 disposed around the crucible 32, a crucible-holding shaft 33 for rotating the crucible 32 and a rotation mechanism (not shown) for rotating the crucible-holding shaft 33, a seed chuck 6 for holding a silicon seed crystal 5, a cable 7 for pulling the seed chuck 6, and a winding mechanism (not shown) for rotating or winding up the cable 7. The crucible 32 includes an inner quartz crucible for containing a silicon melt 2 and an outer graphite crucible located outside the quartz crucible. A heat insulating cylinder 35 is disposed around the heater 34.

In order to establish operating conditions for the production method of the present invention, an annular solid-liquid interface insulator 8 is arranged around the solid-liquid interface of a single crystal, and an upper surrounding insulator 9 is disposed on the solid-liquid interface insulator 8. The solid-liquid interface insulator 8 is disposed such that a gap 10 of 3–5 cm is formed between the lower end of the insulator 8 and the surface of the silicon melt 2. The upper surrounding insulator 9 may be omitted depending on the conditions. Further, there is provided a tubular cooling device 36 for cooling the single crystal by jetting a cooling gas or by shutting off radiant heat.

Recently, a so-called MCZ method has often been employed. When the MCZ is employed, an unillustrated magnet is disposed outside the pull chamber 31 in a horizontal orientation so as to apply a magnetic field to the silicon melt 2 in a horizontal or vertical direction or in a like direction. Through the application of a magnetic field to the silicon melt 2, convection of the melt 2 is suppressed to thereby stably grow a single crystal.

Next will be described a method for growing a single crystal through use of the crystal pulling apparatus 30 of FIG. 6. First, a high-purity polycrystalline material of silicon is heated to its melting point (approximately 1420° C.) or higher and is thus melted in the crucible 32. Next, the cable 7 is released until a tip end of the seed crystal 5 comes into contact with the surface of the melt 2 at a central portion or is immersed into the melt 2 at a central portion. Subsequently, the crucible-holding shaft 33 is rotated in an appropriate direction. At the same time, the cable 7 is rotated and wound up to thereby pull the seed crystal 5. Thus is started the growth of a single crystal. Then, through adequate regulation of the pulling rate and temperature, a substantially cylindrical single-crystal ingot 1 can be obtained.

To achieve the objects of the present invention, the invention employs the following structural features. As shown in FIG. 6, the annular solid-liquid interface insulator 8 is disposed in the pull chamber 31 such that the solid-liquid interface insulator 8 surrounds the liquid portion of the single crystal 1; i.e., the temperature zone of 1420–1400° C. in the vicinity of the surface of the melt. In addition, the upper surrounding insulator 9 is disposed above the solid-liquid interface insulator 8. Further, if necessary, a device for cooling the crystal; for example, the cooling device 36, is disposed on the insulator 9 in order to jet a cooling gas to the crystal from above. Moreover, a radiant heat reflecting plate may be attached to the lower portion of the cylinder.

As mentioned above, an insulator is arranged immediately above the surface of the melt with a predetermined gap formed therebetween, and a device for cooling the crystal is optionally disposed above the insulator. This structure yields a heat retention effect in the vicinity of the crystal growth interface due to the radiant heat. In addition, an upper portion of the crystal is shielded from radiant heat from the heater or the like. As a result, the operating conditions for the production method of the present invention are established.

In addition to the cylindrical cooling device 36, an air-cooled duct, a water-cooled tube, or a like device may be provided, such that the device surrounds a crystal being grown so as to establish a desired temperature gradient within the crystal.

Figure 7:
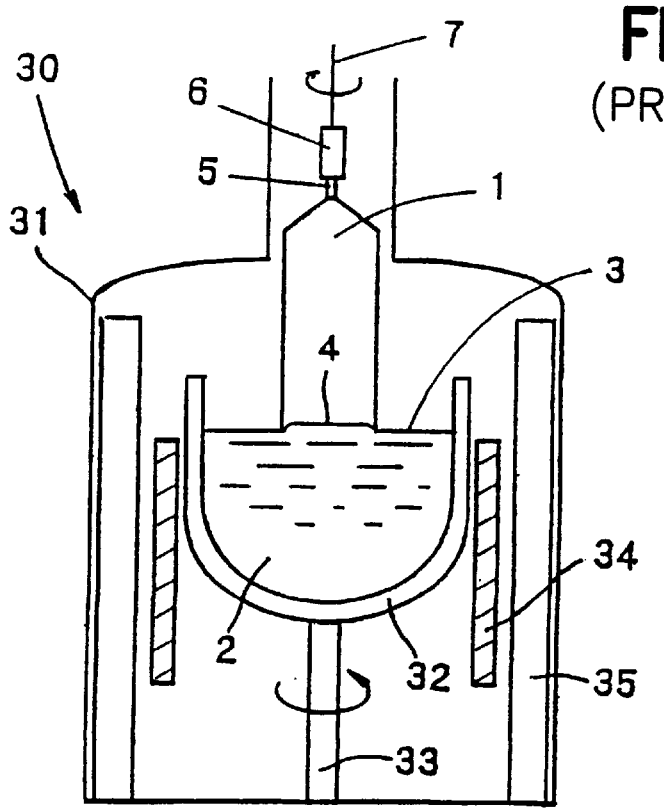
FIG. 7 is a schematic view showing the structure of a conventional single crystal pulling apparatus operated in accordance with the CZ method.

For comparison with the crystal pulling apparatus used in the present invention, a conventional silicon single crystal pulling apparatus is shown in FIG. 7. The basic structure is the same as that of the crystal pulling apparatus used in the present invention. However, the apparatus shown in FIG. 7 lacks the solid-liquid interface insulator 8, the upper surrounding insulator 9, and the cooling device 36.

EXAMPLES

The present invention will next be described by way of examples, which should not be construed as limiting the invention.

Example 1

A silicon single crystal was grown through use of the crystal pulling apparatus 30 of FIG. 6. Polycrystalline material of silicon (60 kg) was charged into a quartz crucible having a diameter of 20 inches. A single-crystal ingot of silicon having a diameter of 6 inches and orientation <100> was pulled while the average pulling rate was varied over the range between 0.88 mm/min and 0.50 mm/min (the length of a straight body portion of the single crystal was approximately 85 cm).

The temperature of a silicon melt was 1420° C. An annular solid-liquid interface insulator having a height of 10 cm was disposed above the melt surface such that a gap of 4 cm was formed between the melt surface and the bottom end of the interface insulator. Through adjustment of a crucible-holding shaft, the height of a ceiling of a pull chamber was adjusted to 30 cm above the melt surface. An upper surrounding insulator was disposed on the interface insulator.

The pulling was performed while the F/G value at the center of the crystal varied within the range of 0.22–0.10 $mm^{2} \cdot °C./min$.

Wafers were sliced from the thus-obtained single crystal ingot. The wafers were mirror-polished, yielding single-crystal mirror wafers of silicon. The thus-obtained mirror wafers were measured in order to determine the grown-in defects. Further, thermal oxidation treatment was performed in order to confirm the presence/absence of an OSF ring.

As a result, when the F/G value was maintained within the range of 0.112–0.142 mm$^2 \cdot$° C./min, there was obtained a wafer having an extremely low defect density in which an OSF ring region appeared during thermal oxidation treatment and was present at a position about 15 mm away from the outer circumferential edge of the wafer, but in which the N regions located inside and outside the ring and having no grown-in defects were extended as much as possible. The oxide dielectric breakdown voltage characteristics of the wafer were such that the C-mode good chip yield was 100%.

The oxide dielectric breakdown voltage characteristics (C-mode) were measured under the following conditions:

1) thickness of oxide film: 25 nm,
2) measurement electrodes: phosphorous-doped polysilicon,
3) area of the electrodes: 8 mm$^2$,
4) current employed for judgment: 1 mA/cm$^2$, and
5) criterion for good chip: a wafer that did not cause dielectric breakdown in an electric field of 8 MV/cm or less was judged to be good.

Example 2

A single crystal ingot was pulled under the same conditions as those used in Example 1, except that the oxygen concentration was gradually decreased during the pulling operation. Wafers were sliced from the thus-obtained single crystal ingot. The wafers were mirror-polished, yielding single-crystal mirror wafers of silicon. The thus-obtained mirror wafers were measured in order to determine the grown-in defects. Further, thermal oxidation treatment was performed in order to confirm the presence/absence of an OSF ring.

The results of evaluation of the wafers of the present embodiment revealed that when a single crystal ingot was pulled such that the F/G value was maintained within the range of 0.112–0.142 mm$^2 \cdot$°C./min and the oxygen concentration became equal to or greater than 24 ppma across the entire wafer surface, each of wafers sliced from the ingot was a wafer in which the entire wafer surface was occupied by the N region including no grown-in defect, and which had an OSF ring at a position about 15 mm away from the center of the wafer.

By contrast, each of wafers in which the oxygen concentration was less than 24 ppma across the entire wafer surface was a defect-free wafer in which the entire wafer surface was occupied by the N region including no grown-in defect, and although OSF nuclei were present, no OSF ring was generated upon performance of thermal oxidation treatment. The oxide dielectric breakdown voltage characteristics of the wafer were such that the C-mode good chip yield was 100%.

Example 3

A single crystal ingot was pulled under the same conditions as those used in Example 1, except that a thermal history was imparted to the single crystal in such a manner that the time required to pass through a temperature zone of 1050–850° C. in the single crystal became 140 minutes or less. Wafers were sliced from the thus-obtained single crystal ingot. The wafers were mirror-polished, yielding single-crystal mirror wafers of silicon. The thus-obtained mirror wafers were measured in order to determine the grown-in defects. Further, thermal oxidation treatment was performed in order to confirm the presence/absence of an OSF ring.

The results of evaluation of the wafers of the present embodiment revealed that even when the oxygen concentration became 27 ppma, if the pulling was performed such that the F/G value was maintained within the range of 0.112–0.142 mm$^2 \cdot$° C./min, wafers sliced from the ingot were defect-free wafers in which the entire wafer surface was occupied by the N region including no grown-in defects, and although OSF nuclei were present, no OSF ring was generated upon performance of thermal oxidation treatment. The oxide dielectric breakdown voltage characteristics of the wafer were such that the C-mode good chip yield was 100%.

The present invention is not limited to the above-described embodiments. The above-described embodiments are mere examples, and those having the substantially same structure as that described in the appended claims and providing the similar action and effects are included in the scope of the present invention.

For example, the above-described embodiment has been described with reference to an exemplary case where a silicon single crystal having a diameter of 6 inches is grown. However, the present invention is not limited thereto, but is applicable to the growth of silicon single crystals having diameters of 8–16 inches, or even larger, so long as the single crystal is pulled such that the F/G value becomes 0.112–0.142 mm$^2$/° C.$\cdot$min at the center of the crystal, where F is the pulling rate (mm/min) of a single crystal, and G is the average intra-crystal temperature gradient (° C./mm) along the pulling direction within a temperature range of the melting point of silicon to 1400° C.

Needless to say, the present invention can be applied to a so-called MCZ method in which a horizontal magnetic filed, a vertical magnetic field, or a cusp magnetic field is applied to silicon melt.

Further, in the above-described embodiment, oxygen concentration reduction and thermal history control are described separately. However, the oxygen concentration reduction and the thermal history control may be performed together. In this case, the OSF ring can be made harmless in a more reliable manner.

What is claimed is:

1. A method for producing a silicon single crystal wafer, wherein a silicon single crystal is grown in accordance with the Czochralski method in a region located between a boundary between a V-rich region and an N region and a boundary between the N region and an I-rich region in a defect distribution chart which shows a defect distribution in which the horizontal axis represents a radial distance D (mm) from the center of the crystal and the vertical axis represent a value of F/G (mm$^2$/° C.$\cdot$min), where F is a pulling rate (mm/min) of the single crystal, and G is an average intra-crystal temperature gradient (° C./mm) along a pulling direction within a temperature range of the melting point of silicon to 1400° C.

2. A method for producing a silicon single crystal wafer according to claim 1, wherein the single crystal is pulled such that the F/G value becomes 0.112–0.142 mm$^2$/° C.$\cdot$min at the center of the crystal.

3. A method for producing a silicon single crystal wafer according to claim 2, wherein control is performed such that the time required to pass through a temperature zone of 1050–850° C. within the crystal becomes 140 minutes or less.

4. A method for producing a silicon single crystal wafer according to claim 1, wherein control is performed such that the time required to pass through a temperature zone of 1050–850° C. within the crystal becomes 140 minutes or less.

* * * * *